United States Patent
Brunet et al.

(10) Patent No.: US 6,191,657 B1
(45) Date of Patent: Feb. 20, 2001

(54) FREQUENCY SYNTHESIZER WITH A PHASE-LOCKED LOOP WITH MULTIPLE FRACTIONAL DIVISION

(75) Inventors: Elie Brunet, Verrieres le Buisson; Jean-Luc de Gouy, Briis Sous Forges; Thierry Ginestet, Fontenay, all of (FR)

(73) Assignee: Thomson-TRT-Defense, Guyancourt (FR)

( * ) Notice: Under 35 U.S.C. 154(b), the term of this patent shall be extended for 0 days.

(21) Appl. No.: 07/731,405

(22) Filed: Jul. 2, 1991

(30) Foreign Application Priority Data

Aug. 21, 1990 (FR) .................................................. 90 10512

(51) Int. Cl.[7] .................................................. H03L 7/00
(52) U.S. Cl. .............................................. 331/1 A; 331/25
(58) Field of Search ........................................ 331/1 A, 25

(56) References Cited

U.S. PATENT DOCUMENTS

| | | | |
|---|---|---|---|
| 4,573,176 | * | 2/1986 | Yeager .................................. 331/1 A |
| 4,918,403 | * | 4/1990 | Martin .................................. 331/1 A |
| 5,070,310 | * | 12/1991 | Hietala et al. ........................ 331/1 A |
| 5,122,767 | * | 6/1992 | Molina .................................. 331/1 A |

\* cited by examiner

*Primary Examiner*—Gregory C. Issing
(74) *Attorney, Agent, or Firm*—Oblon, Spivak, Mcclelland, Maier & Neustadt, P.C.

(57) ABSTRACT

A frequency synthesizer comprises a single phase-locked loop controlled by a reference clock formed by a voltage-controlled oscillator, a programmable divider with variable division rank M, a phase detector, and a loop filter. It also comprises a predetermined number n of fractional division structures, each implementing a frequency step $P_i \times F_{reF}$ lower than the reference frequency $F_{ref}$. Each fractional structure is coupled in parallel with said programmable divider to add to said division rank M fractional increments $P_i$ such that the ratio between the frequency $F_{vco}$ provided by said oscillator and said reference frequency be defined as a function of said increments $P_i$ by the relationship:

$$F_{vco} = \left( M \sum_1^n P_i \right) F_{ref}.$$

5 Claims, 4 Drawing Sheets

FREQUENCY SYNTHESIZER WITH A PHASE-LOCKED LOOP WITH MULTIPLE FRACTIONAL DIVISION

BACKGROUND OF THE INVENTION

The present invention relates to a frequency synthesizer with a phase-locked loop with multiple fractional division.

A frequency synthesizer with a phase-locked loop comprises conventionally in the manner described, for example, in the book of U. L. Rhode entitled "Digital PLL frequency Synthesizers—Theory and Design", 1983, Prentice Hall Inc. Englewoods Cliffs, a voltage-controlled oscillator, a variable-modulo divider, a phase detector, clock providing a reference frequency $F_{ref}$, and possibly a loop filter. When the loop is locked, if M denotes the value set for the divider, the output frequency $F_{vco}$ from the voltage-controlled oscillator is equal to M times the value of the reference frequency $F_{ref}$. When the value M set for the divider changes, the synthesized frequencies obtained change by steps equal to the reference frequency $F_{ref}$, within the operating limits of the voltage-controlled oscillator.

To obtain a frequency synthesis step lower than $F_{ref}$, it is known to introduce a fractional division loop which produces a frequency increment equal to a/Q times the reference frequency $F_{ref}$, where Q is equal to the quotient of the reference frequency by the desired frequency step, where $0 \leq a \leq Q-1$.

Through a digital phase accumulator system, the main division ratio M is incremented by one unit for every occurrence of Q cycles of the reference frequency. The frequency step is then equal to the reference frequency divided by Q.

The advantage of this approach is that for comparable characteristics, the number of steps M to be set for the divider is reduced and that the loop filter has a higher cutoff frequency, which improves the response of the loop.

However, while the foregoing device is well suited to frequency synthesis, it is not appropriate for the synthesizers modulated in frequency or in phase from a modulation introduced, for example, in the reference frequency, for it appears that the maximum rate of this modulation is limited to low values. In addition, the synthesis frequency lines which appear at the output of the voltage-controlled oscillator and which are mainly due to the phase jitter of the phase comparator have relatively high levels which give to these synthesizers a relatively poor spectral purity.

However, when using not a single fractional division structure, but two of them, as is described in the French patent application NO 2 426 358 entitled "Synthétiseur de fréquence à division directe à pas après virgule", it is possible to improve in a very significant manner the spectral purity of the signals from the synthesizers with fractional division.

However, for some applications, this improvement is not sufficient, in particular it does not allow to use such synthesizers in communications systems with fast frequency agility.

SUMMARY OF THE INVENTION

A purpose of the present invention is to remedy the above-mentioned disadvantages.

To this end, an object of the present invention is a frequency synthesizer with a phase-locked loop with multiple fractional division of the type comprising a single phase-locked loop controlled by a reference clock and comprised of a voltage-controlled oscillator, a programmable divider with variable division rank M, a phase detector, and a loop filter, characterized in that it also comprises a predetermined number n of fractional division structures, each implementing a frequency step $P_i \times F_{ref}$ lower than the reference frequency $F_{ref}$, and in that each fractional division strucre is coupled in parallel with the programmable divider to add to the division rank M fractional increments $P_i$ such that the ratio between the frequency $F_{vco}$ provided by the voltage-controlled oscillator and the reference frequency $F_{ref}$ be defined as a function of the increments $P_i$ by the relationship :

$$F_{vco} = \left(M + \sum_{1}^{n} P_i\right) F_{ref}.$$

BRIEF DESCRIPTION OF THE DRAWINGS

Other features and advantages of the present invention will become apparent from the following detailed description of preferred embodiments given as a non-limitative example with reference to the accompanying drawings, in which.

DESCRIPTION OF THE PREFERRED EMBODIMENTS

Figure 1:
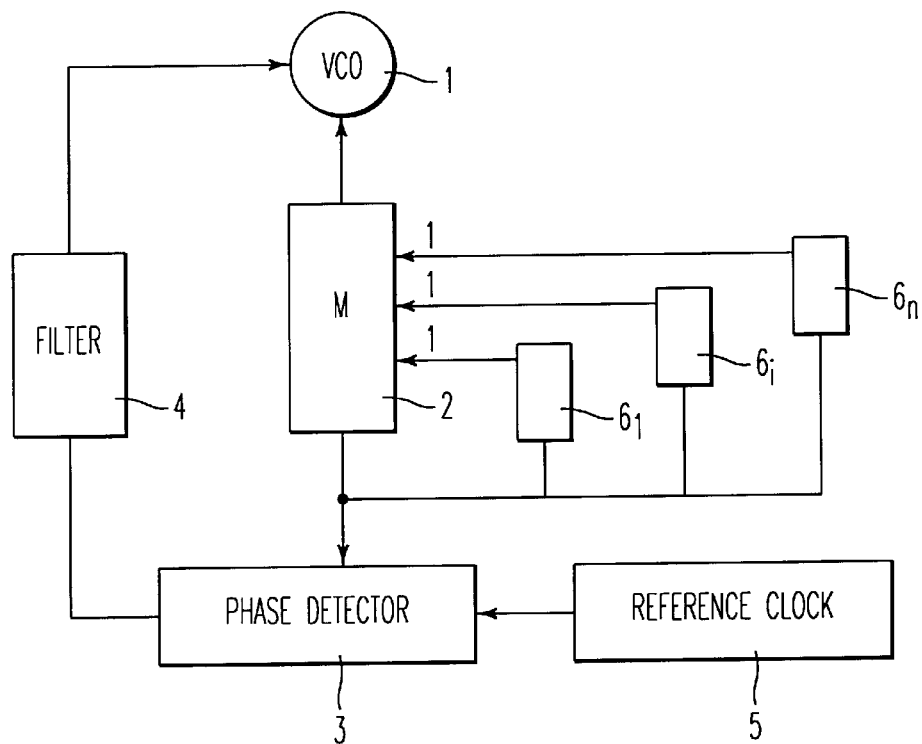
FIG. 1 is a block diagram of a synthesizer according to the present invention.

The synthesizer according to the present invention which is shown in FIG. 1 comprises a single phase-locked loop composed of a voltage-controlled oscillator 1, a programmable 2 with variable division rank M, a phase detector 3, and a loop filter 4, all these elements being cascaded in this order. A reference clock 5 providing a reference frequency $F_{ref}$ supplies the phase detector 3 to determine, when the loop is locked to the proper frequency, the phase deviation between the signal provided by the clock 5 and the signal provided by the divider 2. It also comprises n fractional division structures $6_1, \ldots, 6_i$ through $6_n$, each of which implements a frequency step lower than the reference frequency $F_{ref}$, of the form $(a/Q)F_{ref}$, where Q is equal to the quotient of the reference frequency by the desired frequency step, and $\underline{a}$ is an integer such that $0 \leq a \leq Q-1$.

By choosing for each fractional division numbers $Q_1, Q_2, \ldots, Q_i, \ldots, Q_n$ which are relatively prime numbers, and $a_1, \ldots, a_n$ such that:

$$0 \leq a_1 \leq Q_1-1 \ \ 0 \leq a_2 \leq Q_2-1 \ldots 0 \leq a_n \leq Q_n-1,$$

the synthesizer shown in FIG. 1 allows to perform the synthesis of frequencies $F_{vco}$ such that:

$$F_{vco} = \left(M + \frac{a_1}{Q_1} + \frac{a_2}{Q_2} + \ldots \frac{a_i}{Q_i} + \ldots + \frac{a_n}{Q_n}\right)F_{ref} = \left(M + \sum_1^n P_i\right)F_{ref}, \quad (1)$$

where $P_i = a_i/Q_i$,
with a frequency step equal to the quotient of the reference frequency $F_{ref}$ by the product of the prime numbers $Q_1$, $Q_2$, ..., $Q_n$. Under these conditions, the divider 2 is incremented by one unit $a_1$ times every $Q_1$ reference cycles, $a_2$ times every $Q_2$ reference cycles, ..., $a_i$ times every $Q_i$ reference cycles, and $a_n$ times every $Q_n$ reference cycles.

The advantage of this approach is that it provides a significant improvement of the level of the frequency lines about the output frequency of the synthesizer with respect to all known synthesis devices with fractional division of the prior art. In the example of application of the foregoing principle to the implementation of a synthesizer allowing to cover a frequency band between 225 and 400 MHz shown in FIG. 2, where the elements corresponding to those of FIG. 1 are denoted by the same reference numerals, the number of fractional division structures $6_1$ through $6_4$ is limited to 4, and the variable-rank divider 2 is composed of a front divider $2_1$ and a end-divider $2_2$. In contrast with FIG. 1, the synthesizer includes a multiply-by-four circuit 7 between the oscillator 1 and the divider 2.

In this example, the reference frequency $F_{ref}$=10.5 MHz. The front divider $2_1$ is a variable divider whose division ratio is adjustable by applying a 0 or a 1 to each of its four inputs.

Each element $6_1$ through $6_4$ is formed by an adder modulo an integer $Q_i$, which is programmable by integers $a_i \leq Q_i$.

In the above example, the modulos $Q_i$ of the adders $6_1$ through $6_4$ have respectively the values $Q_1$=3, $Q_2$=4, $Q_3$=5 and $Q_4$=7, which are relatively prime numbers.

The frequency step is then of:

10.5 MHz/(3×4×5×7)=25 kHz at the output of the multiply-by-four circuit 7 and consequently of 6.25 kHz for the oscillator 1.

Applying the relationship (1) gives:

$F_{ref}/Q_1$=3.5 MHz;

$F_{ref}/Q_2$=2.625 MHz;

$F_{ref}/Q_3$=2.1 MHz; and $F_{ref}/Q_4$=1.5 MHz.

The lowest frequency synthesis step, that is, 25 kHz at the output of the multiply-by-four circuit 7 (6.25 kHz at the outputof the oscillator 1) is obtained by performing the operation:

$1(F_{ref}/Q_2)+4(F_{ref}/Q_3)+2(F_{ref}/Q_1)+2(F_{ref}/Q_4)-2F_{ref}$, that is:

1×2.625 MHz+4×2.1 MHz+2×3.5 MHz+2×1.5 MHz−21 MHz=25 kHz.

Figure 3A:
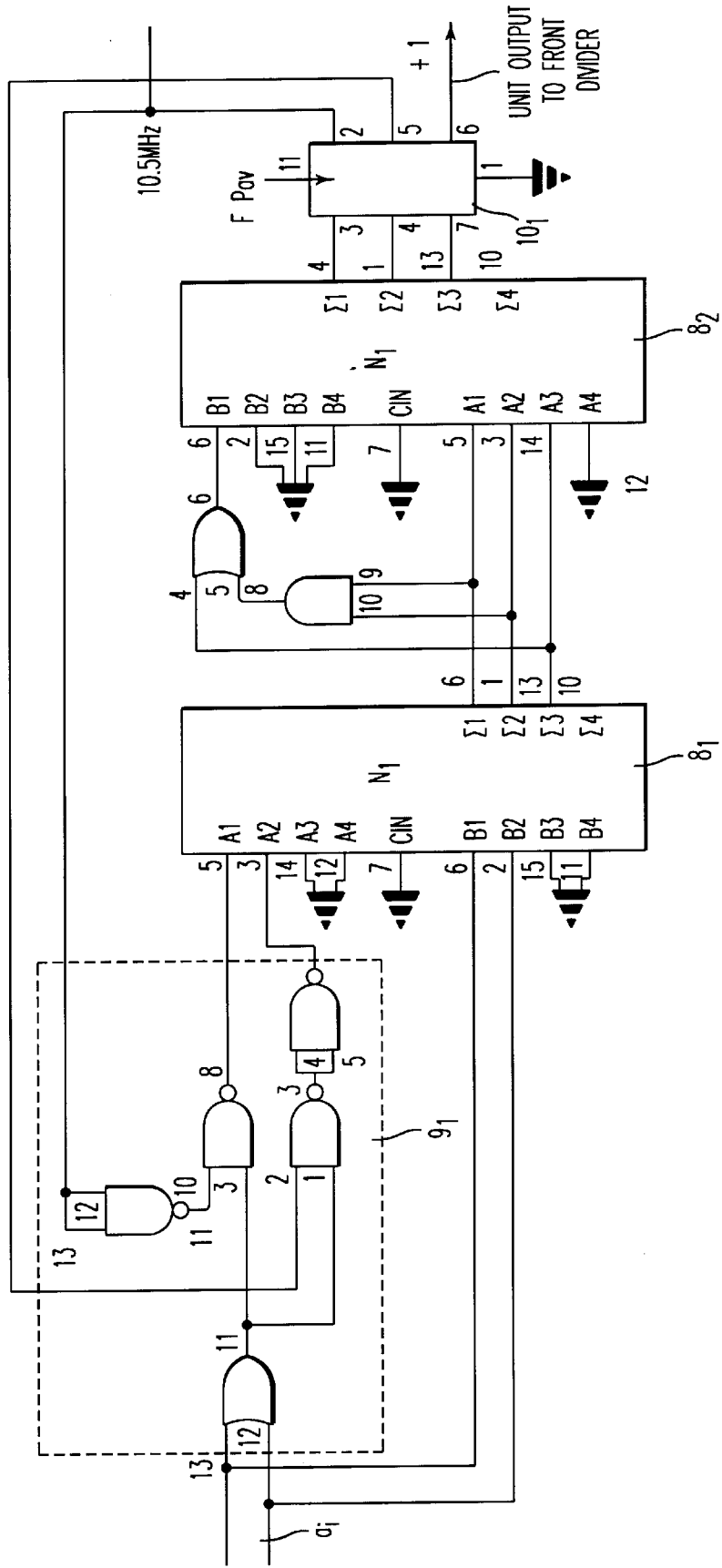
FIGS. 3A and 3B are circuit diagrams of two embodiments of a fractional division loop for controlling a front divider in FIG. 2.
Figure 3B:
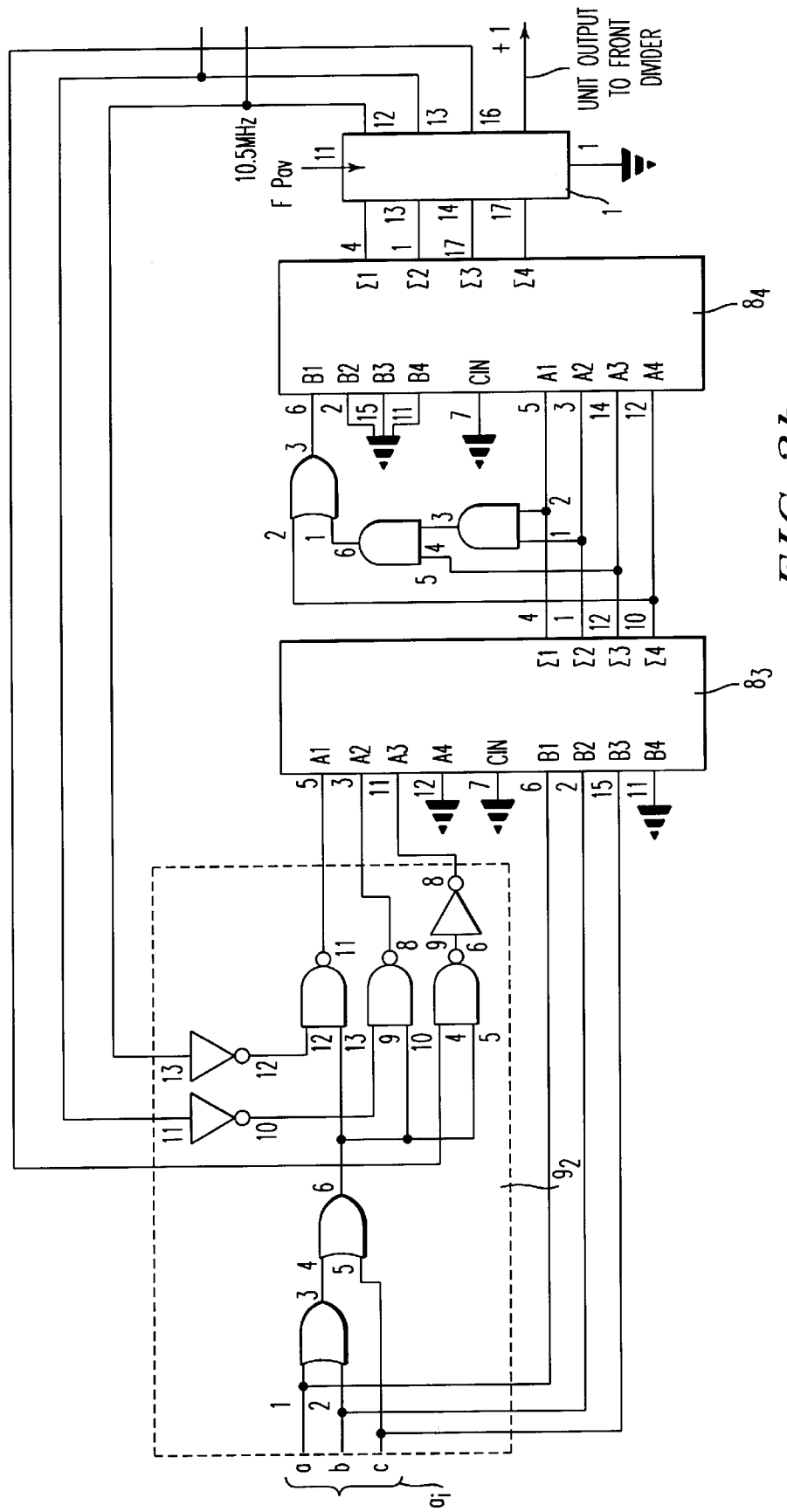

Examplary embodiments of the adders 0, 1, 2 modulo 3 and 0, 1, ..., 6 modulo 7 for the implementation of the adders $6_1$ through $6_4$ are shown in FIGS. 3A and 3B. They comprise adder circuits $8_1$ through $8_4$ of the type of those known under the reference number 74F283 marketed by National Semiconductor and Motorola. These circuits are programmed by the numbers $a_i$ by means of logical interface circuits $9_1$ and $9_2$. Registers $10_1$ and $10_2$ placed at the output of the divider circuits $8_2$ and $8_4$, respectively, allows to store at each increment of the reference frequency $F_{ref}$ the state of the divider to increase it by the value $a_i$ at the next increment.

Figure 2:
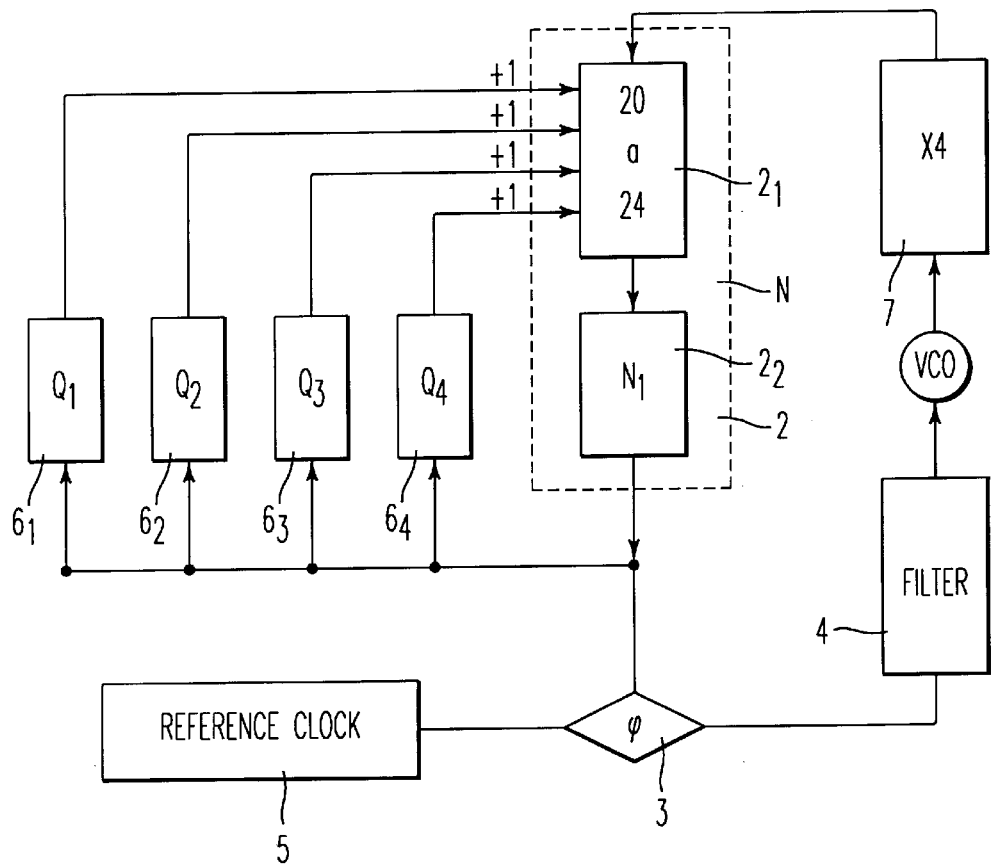
FIG. 2 shows the architecture of a synthesizer according to the present invention capable of operating over a range of frequencies extending from 225 MHz to 400 MHz.
Figure 4:
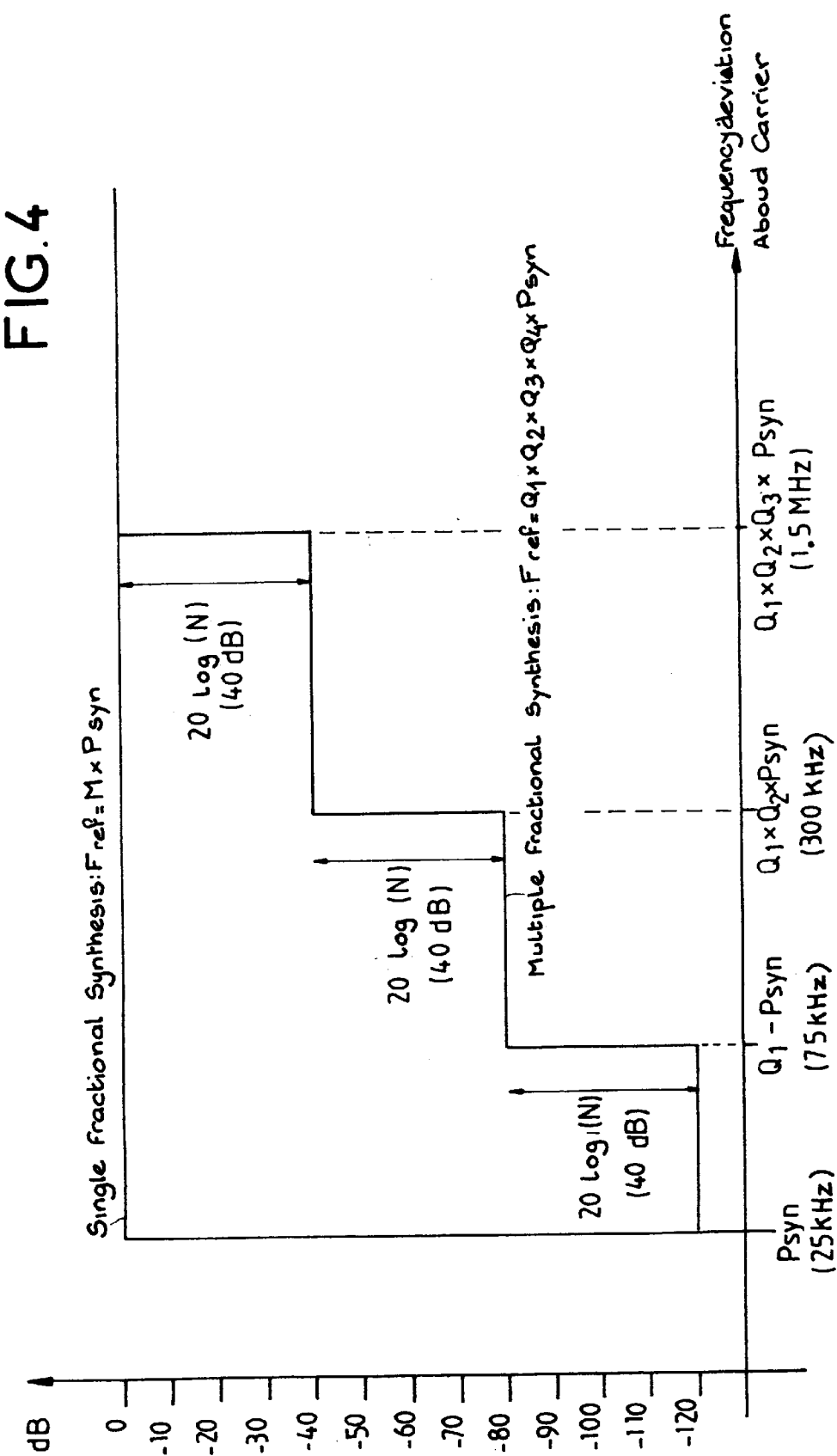
FIG. 4 is a plot for comparing the theoretical level of the frequency synthesis lines obtained with a single fractional synthesis and with a multiple fractional synthesis.

The plot in FIG. 4 illustrates the spectral purity obtained with a synthesizer with multiple fractional synthesis of the type shown in FIG. 2 as compared to that which can be obtained with a simple fractional synthesizer. This graph shows that for the modulos $Q_1$=3, $Q_2$=4, $Q_3$=5, $Q_4$=7, and a frequency step $P_{syn}$=25 kHz leading to a reference frequency $F_{ref}$=10.5 MHz, the theoretical level of the lines about the synthesized carrier frequency drops successively by 40 dB a first time for $F_1=Q_1 \times Q_2 \times Q_3 \times P_{syn}$=1.5 MHz, a second time for $F_2=Q_1 \times Q_2 \times P_{syn}$=300 kHz, a third time for $F_3=Q_1 \times P_{syn}$= 75 kHz, and finally a fourth time for $F_4=P_{syn}$=25 kHz. With a synthesis frequency band with single fractional division, the level of the lines between the frequency step of 25 kHz and the synthesized carrier frequency remains at 0 dB, whereas with the loop shown in FIG. 2, the latter drops suddenly by 40 dB as soon as the frequency reaches 1.5 MHz.

What is claimed is:

1. A frequency synthesizer with a phase-locked loop with multiple fractional division, of the type comprising a single phase-locked loop controlled by a reference clock and formed by a voltage-controlled oscillator, a programmable divider with variable division rank M, a phase detector, and a loop filter, comprising in addition a predetermined number n of fractional division structures, each implementing a desired frequency step lower than the reference frequency $F_{ref}$, and wherein each fractional division structure is coupled in parallel with said programmable divider in order to add fractional increments $P_i$ to said division rank M such that the ratio between the frequency $F_{vco}$ provided by said voltage-controlled oscillator and said reference frequency $F_{ref}$ be defined as a function of said increments $P_i$ by the relationship:

$$F_{vco} = \left(M + \sum_1^n P_i\right)F_{ref}.$$

2. A synthesizer according to claim 1, wherein each of said fractional division structures provides the product of said reference frequency by a fractional number $P_i=a_i/Q_i$, where $0<a_i<Q_i$, the numbers with respect to each other $Q_i$ being relatively prime numbers.

3. A synthesizer according to claim 2, wherein said desired frequency step is equal to said reference frequency divided by the product of said numbers $Q_i$.

4. A synthesizer according to claim 3, wherein each of said n fractional division structures comprises a programmable modulo-$Q_i$ divider with a variable division rank $a_i$.

5. A synthesizer according to claim 4, wherein said division rank M of said programmable divider of the single loop is increased by one by each of said n fractional division structures $a_i$ times every modulo $Q_i$ of each structure.

* * * * *